US008796539B2

(12) United States Patent
Asaumi et al.

(10) Patent No.: US 8,796,539 B2
(45) Date of Patent: Aug. 5, 2014

(54) SOLAR CELL

(75) Inventors: Toshio Asaumi, Kobe (JP); Hitoshi Sakata, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 13/246,021

(22) Filed: Sep. 27, 2011

(65) Prior Publication Data

US 2012/0012179 A1 Jan. 19, 2012

Related U.S. Application Data

(63) Continuation of application No. PCT/JP2010/055195, filed on Mar. 25, 2010.

(30) Foreign Application Priority Data

Mar. 30, 2009 (JP) ................................ 2009-081023

(51) Int. Cl.
H01L 31/00 (2006.01)
H01L 31/0224 (2006.01)

(52) U.S. Cl.
CPC .............................. H01L 31/022441 (2013.01)
USPC ....................................................... 136/256

(58) Field of Classification Search
USPC ....................................................... 136/256
See application file for complete search history.

(56) References Cited

U.S. PATENT DOCUMENTS

| 5,646,050 A * | 7/1997 | Li et al. ............................. 438/96 |
| 5,676,765 A * | 10/1997 | Saito et al. ...................... 136/258 |
| 2002/0050288 A1* | 5/2002 | Suzuki ........................... 136/255 |
| 2005/0062041 A1 | 3/2005 | Terakawa et al. |
| 2006/0174935 A1* | 8/2006 | Sawada et al. ................ 136/261 |
| 2009/0014063 A1* | 1/2009 | Stangl et al. ................... 136/256 |
| 2011/0000532 A1* | 1/2011 | Niira et al. ..................... 136/255 |

FOREIGN PATENT DOCUMENTS

| JP | 2005-101151 A | 4/2005 |
| JP | 2005-101240 A | 4/2005 |
| JP | 2006-324590 A | 11/2006 |
| WO | WO 2010/113750 A1 | 12/2010 |

OTHER PUBLICATIONS

International Search Report for corresponding PCT Application No. PCT/JP2010/055195, Jul. 13, 2010, pp. 1-3.

Written Opinion of the International Searching Authority filed in PCT Application No. PCT/JP2010/055195, mailing date: Jul. 13, 2010.

* cited by examiner

Primary Examiner — Jeffrey T Barton
Assistant Examiner — Uyen Tran
(74) Attorney, Agent, or Firm — Ditthavong & Steiner, P.C.

(57) ABSTRACT

A solar cell, wherein contamination with an undesired impurity is suppressed, and solar cell characteristics are excellent. This solar cell is provided with: a semiconductor substrate having a photoreceiving surface and a back surface; a first semiconductor layer of a first conductivity type formed on a prescribed region of the back surface of the semiconductor substrate; a second semiconductor layer of a second conductivity type formed to extend over the back surface of the semiconductor substrate and the surface of the first semiconductor layer; and a cap layer formed between the first semiconductor layer and the second semiconductor layer, and containing no impurity of the first conductivity type.

20 Claims, 7 Drawing Sheets

SOLAR CELL

CROSS-REFERENCE TO RELATED APPLICATION

The priority application number JP2009-081023, Solar Cell, Mar. 30, 2009, Toshio Asaumi and Hitoshi Sakata, upon which this patent application is based is hereby incorporated by reference. This application is a continuation of PCT/JP2010/055195, Solar Cell, Mar. 25, 2010, Toshio Asaumi and Hitoshi Sakata.

BACKGROUND OF THE INVENTION

1. Field of the Invention

The present invention relates to a back-junction solar cell.

2. Description of the Background Art

In general, the so-called back-junction solar cell including a semiconductor layer on a back surface of a substrate is proposed.

In Japanese Patent Laying-Open No. 2005-101151, there is disclosed a photovoltaic device including a semiconductor substrate having a photoreceiving surface and a back surface, an i-type semiconductor layer formed on the back surface of the semiconductor substrate, a p-type semiconductor layer formed on a prescribed region of the surface of the i-type semiconductor layer and an n-type semiconductor layer formed to extend over the surface of the i-type semiconductor layer and the surface of the p-type semiconductor layer. The photovoltaic device described in Japanese Patent Laying-Open No. 2005-101151 is manufactured by plasma CVD through a step of forming the i-type semiconductor layer on the back surface of the semiconductor substrate, a step of forming the p-type semiconductor layer on the prescribed region of the surface of the i-type semiconductor layer and a step of forming the n-type semiconductor layer to extend over the surface of the i-type semiconductor layer and the surface of the p-type semiconductor layer.

In the case of manufacturing the photovoltaic device described in Japanese Patent Laying-Open No. 2005-101151 by plasma CVD, however, a p-type impurity contained in the p-type semiconductor layer desorbs from the layer due to plasma generated in the step of forming the n-type semiconductor layer to extend over the surface of the i-type semiconductor layer and the surface of the p-type semiconductor layer. The desorbing p-type impurity adheres to the surface of the p-type semiconductor layer and the surface of the i-type semiconductor layer. Consequently, the space between the semiconductor substrate and the n-type semiconductor layer is contaminated with the undesired p-type impurity, and hence there is a possibility that the characteristics of a solar cell lower, and there is such a problem that it is difficult to manufacture a solar cell having excellent solar cell characteristics with a high yield.

The present invention has been proposed in order to solve the aforementioned problem, and an object of the present invention is to provide a solar cell having excellent solar cell characteristics by suppressing contamination with an undesired impurity.

SUMMARY OF THE INVENTION

A solar cell according to an aspect of the present invention includes a semiconductor substrate having a photoreceiving surface and a back surface, a first semiconductor layer of a first conductivity type formed on a prescribed region of the back surface of the semiconductor substrate, a second semiconductor layer of a second conductivity type formed to extend over the back surface of the semiconductor substrate and the surface of the first semiconductor layer, and a cap layer, formed between the first semiconductor layer and the second semiconductor layer, made of a semiconductor or an insulator substantially containing no impurity of the first conductivity type.

According to the present invention, a back-junction solar cell having excellent solar cell characteristics can be provided.

DESCRIPTION OF THE PREFERRED EMBODIMENTS

Figure 1:
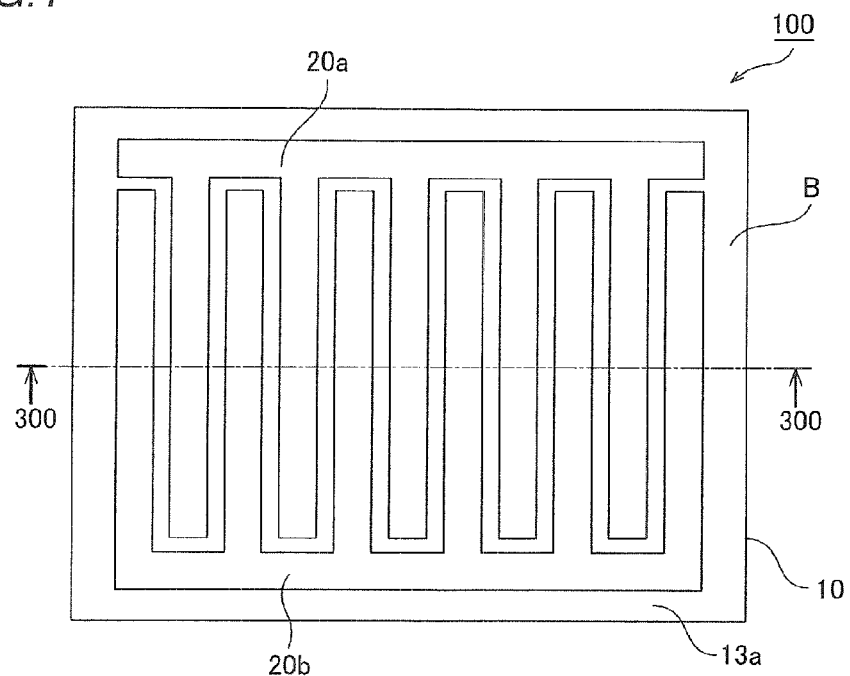
FIG. 1 is a plan view of a back surface of a solar cell according to a first embodiment of the present invention.

Embodiments of the present invention are now described with reference to the drawings. In the following description of the drawings, identical or similar reference numerals are assigned to identical or similar portions. However, it is to be noted that the drawings are schematic ones, and the ratios etc. of respective dimensions are different from the actual ones. Therefore, the specific dimensions etc. must be determined in consideration of the following description. Further, portions whose mutual dimensional relations and ratios are different from each other are also included in the drawings, as a matter of course.

First Embodiment (Structure of Solar Cell)

The structure of a solar cell 100 according to a first embodiment of the present invention is described with reference to FIGS. 1 and 2.

Figure 2:
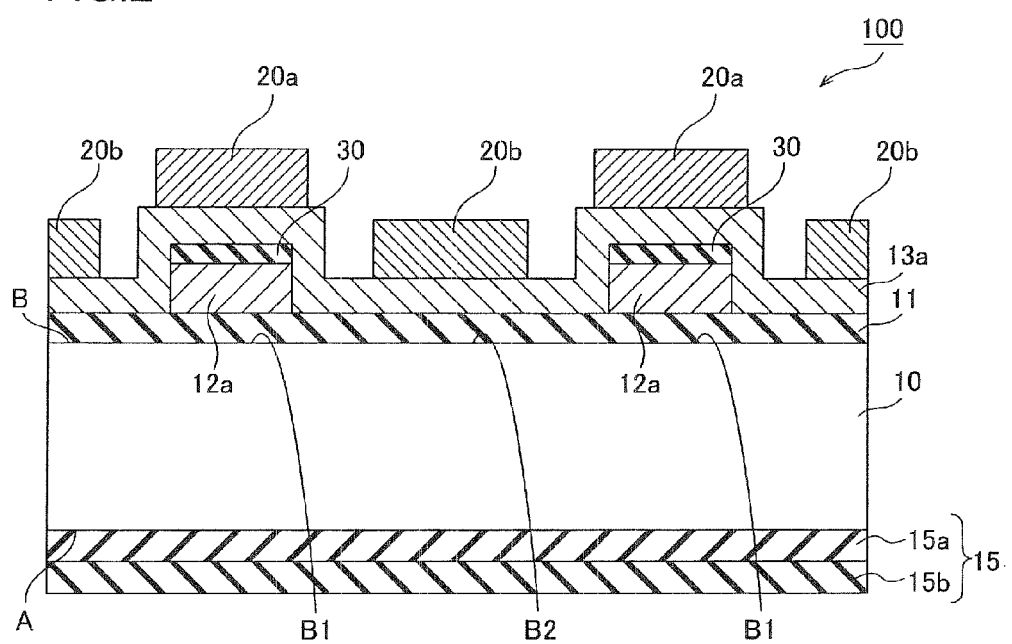
FIG. 2 is an enlarged sectional view taken along the line 300-300 in FIG. 1.

As shown in FIGS. 1 and 2, the solar cell 100 is provided with a substrate 10 made of a semiconductor. As shown in FIG. 2, the substrate 10 is a semiconductor substrate in the form of a thin plate, and has a p-type or n-type conductivity type. The substrate 10 is made of crystalline silicon such as single-crystalline silicon or polycrystalline silicon, a compound semiconductor such as GaAs or InP, or still another semiconductor which can be formed in a plate shape. The substrate 10 is an example of the "semiconductor substrate" in the present invention.

The substrate 10 has a photoreceiving surface A and a back surface B. The photoreceiving surface A is a surface upon which light is incident. The back surface B is a surface opposite to the photoreceiving surface A. Both of the photoreceiving surface A and the back surface B are major surfaces of the substrate 10. The back surface B has a first region B1 and a second region B2.

Carriers are formed in the substrate 10 due to the light incident upon the photoreceiving surface A. The carriers denote electrons and holes formed by the light absorbed by the substrate 10.

A light incidence-side structure 15 is provided on the side of the photoreceiving surface A of the substrate 10 of the solar cell 100. On the other hand, an i-type amorphous semiconductor layer 11, a p-type amorphous semiconductor layer 12a, an n-type amorphous semiconductor layer 13a, a p-side electrode 20a and an n-side electrode 20b are provided on the side of the back surface B of the substrate 10 of the solar cell 100. The i-type amorphous semiconductor layer 11 is an example of the "third semiconductor layer" in the present invention, the p-type amorphous semiconductor layer 12a is an example of the "first semiconductor layer" in the present invention, and the n-type amorphous semiconductor layer 13a is an example of the "second semiconductor layer" in the present invention.

In a case where the substrate 10 has n-type conductivity in the solar cell of this structure, a junction for forming an electric field for carrier separation is formed between the substrate 10 and the p-type amorphous semiconductor layer 12a, while a junction for forming an electric field for preventing recombination of minority carriers is formed between the substrate 10 and the n-type amorphous semiconductor layer 13a. In a case where the substrate 10 has p-type conductivity, a junction for forming an electric field for carrier separation is formed between the substrate 10 and the n-type amorphous semiconductor layer 13a, while a junction for forming an electric field for preventing recombination of minority carriers is formed between the substrate 10 and the p-type amorphous semiconductor layer 12a.

The light incidence-side structure 15 is formed to transmit part of the incident light to the side of the semiconductor substrate 10. Therefore, part of the incident light is transmitted through the light incidence-side structure 15 and incident upon the photoreceiving surface A of the semiconductor substrate 10. The light transmittance of the light incidence-side structure 15 is preferably large, in order to increase the quantity of the light incident upon the semiconductor substrate 10. Therefore, the light incidence-side structure 15 preferably includes no layer such as a metal layer, for example, having small light transmittance.

The light incidence-side structure 15 is constituted of a passivation film 15a and an antireflective film 15b. The light incidence-side structure 15 is constituted of a single layer of an amorphous semiconductor layer, a silicon oxide layer or a silicon nitride layer, or a multilayer structure of such layers. The structure of the light incidence-side structure 15 is not restricted to this, but the light incidence-side structure 15 can take any structure.

The i-type amorphous semiconductor layer 11 is formed substantially on the whole of the back surface B of the substrate 10. More specifically, the i-type amorphous semiconductor layer 11 is formed on the first region B1 of the back surface B of the substrate 10 on which the p-type amorphous semiconductor layer 12a is formed and the second region B2 adjacent to the first region B1. Further, the i-type amorphous semiconductor layer 11 is formed between the semiconductor substrate 10 and the p-type and n-type amorphous semiconductor layers 12a and 13a. In addition, the i-type amorphous semiconductor layer 11 is formed in an atmosphere into which no p-type and n-type impurities are positively introduced. In other words, the i-type amorphous semiconductor layer 11 has a substantially intrinsic conductivity type. The i-type amorphous semiconductor layer 11, substantially containing no p-type and n-type impurities, may contain a small quantity. Also in a case where source gas contains no impurity, contamination with an impurity desorbing from a film adhering to a substrate tray or a chamber wall may take place, and a small quantity of impurity is contained in the i-type amorphous semiconductor layer 11 in this case. The thickness of the i-type amorphous semiconductor layer 11 is at a degree substantially not contributing to power generation, and about several nm to 25 nm, for example.

The p-type amorphous semiconductor layer 12a is formed on the first region B1 of the back surface B of the substrate 10. According to the first embodiment, the p-type amorphous semiconductor layer 12a is formed on the surface of the i-type amorphous semiconductor layer 11 on the first region B1 of the back surface B of the substrate 10. The thickness of the p-type amorphous semiconductor layer 12a is about 10 nm, for example.

The n-type amorphous semiconductor layer 13a is formed substantially on the whole of the surface of the i-type amorphous semiconductor layer 11. More specifically, the n-type amorphous semiconductor layer 13a is formed to extend over the surface of the i-type amorphous semiconductor layer 11 and the surface of a cap layer 30 described later.

Each of the i-type amorphous semiconductor layer 11, the p-type amorphous semiconductor layer 12a and the n-type amorphous semiconductor layer 13a is preferably made of a hydrogenated amorphous semiconductor containing silicon. As such an amorphous semiconductor, there is amorphous silicon, amorphous silicon carbide, or amorphous silicon germanium. The i-type amorphous semiconductor layer 11, the p-type amorphous semiconductor layer 12a and the n-type amorphous semiconductor layer 13a are not restricted to this material, but may be made of another amorphous semiconductor, and not restricted to the amorphous semiconductor, but may be made of another thin-film semiconductor.

Further, the i-type amorphous semiconductor layer 11, the p-type amorphous semiconductor layer 12a and the n-type amorphous semiconductor layer 13a are not restricted to such ones that the overall layers are in complete amorphous states, but may partially have crystalline regions. For example, the layers may be those of the so-called microcrystalline states containing large numbers of small crystalline regions therein. In addition, the i-type amorphous semiconductor layer 11, the p-type amorphous semiconductor layer 12a and the n-type amorphous semiconductor layer 13a may be single layers, or multilayers.

The p-side electrode 20a is an electrode collecting carriers. The p-side electrode 20a is formed on the p-type amorphous semiconductor layer 12a while holding the n-type amorphous semiconductor layer 13a therebetween. Therefore, the p-side electrode 20a is formed on the first region B1 of the back surface B of the substrate 10.

The n-side electrode 20b is an electrode collecting carriers. The n-side electrode 20b is formed on the second region B2 of the back surface B of the substrate 10 while holding the n-type amorphous semiconductor layer 13a therebetween. Further, the n-side electrode 20b is formed on the surface of the n-type amorphous semiconductor layer 13a on the second region B2 of the back surface B of the substrate 10.

The p-side electrode 20a and the n-side electrode 20b are made of a metallic material or a conductive paste material. Further, the p-side electrode 20a and the n-side electrode 20b are formed by any method such as sputtering, vapor deposition, plating or printing.

According to the first embodiment, the cap layer 30 is formed between the p-type amorphous semiconductor layer 12a and the n-type amorphous semiconductor layer 13a. More specifically, the cap layer 30 is formed between the upper surface of the p-type amorphous layer 12a and the n-type amorphous semiconductor layer 13a. The cap layer 30 is so formed that the thickness thereof is smaller than the thicknesses of the p-type amorphous semiconductor layer 12a and the n-type amorphous semiconductor layer 13a. Further, the cap layer 30 is formed to inhibit the p-type impurity from desorbing from the p-type amorphous semiconductor layer 12a serving as an underlayer.

The cap layer 30 is made of a semiconductor or an insulator substantially containing no impurity for doping contained in the semiconductor layer serving as the underlayer. The cap layer 30, substantially containing no impurity, may contain a small quantity of impurity. Also in a case where source gas contains no impurity, contamination with an impurity desorbing from a film adhering to a substrate tray or a chamber wall may take place, and a small quantity of impurity is contained in the cap layer 30 in this case. According to the first embodiment, the cap layer 30 is made of the material containing no p-type impurity, whereby no p-type impurity desorbs from the cap layer 30 by plasma for forming the n-type amorphous semiconductor layer 13a. Therefore, the cap layer 30 can inhibit the p-type impurity from desorbing from the p-type amorphous semiconductor layer 12a by the plasma for forming the n-type amorphous semiconductor layer 13a. Thus, the space between the substrate 10 and the n-type amorphous semiconductor layer 13a can be inhibited from contamination with an unintended p-type impurity, whereby solar cell characteristics can be improved.

The cap layer 30 is preferably made of a material containing no n-type impurity. In other words, the cap layer 30 is preferably made of a material containing neither a p-type impurity nor an n-type impurity. In this case, a p-type impurity and an n-type impurity can be inhibited from desorbing from the cap layer 30 by the plasma for forming the n-type amorphous semiconductor layer 13a. Further, the cap layer 30 can prevent the p-type impurity from desorbing from the p-type amorphous semiconductor layer 12a by the plasma for forming the n-type amorphous semiconductor layer 13a. Therefore, the cap layer 30 can inhibit undesired p-type impurity and n-type impurity from being contained in the space between the substrate 10 and the n-type amorphous semiconductor layer 13a. Thus, the junction between the substrate 10 and the n-type amorphous semiconductor layer 13a can be formed as designed, whereby the solar cell characteristics can be further improved.

The cap layer 30 preferably contains no impurity exerting a remarkable bad influence on the semiconductor layer serving as the underlayer. For example, the cap layer 30 preferably contains neither organic matter nor an alkaline component. Even if part of the constituent element desorbs from the cap layer 30 by the plasma for forming the n-type amorphous semiconductor layer 13 in this case, the desorbing element can be inhibited from exerting a bad influence on the semiconductor layer serving as the underlayer. Thus, reduction of junction characteristics between the substrate 10 and the n-type amorphous semiconductor layer 13a can be suppressed, whereby the solar cell characteristics can be excellently maintained.

The cap layer 30 is preferably made of the same semiconductor material as the semiconductor layer serving as the underlayer. For example, the underlayer is the p-type amorphous semiconductor layer 12a in the first embodiment, and hence the cap layer 30 is preferably made of an amorphous semiconductor material. The cap layer 30 made of an amorphous semiconductor can be formed under conditions similar to those for the p-type amorphous semiconductor layer 12a. Thus, the p-type amorphous semiconductor layer 12a can be inhibited from being excessively influenced by an atmosphere at the time of forming the cap layer 30. Further, reduction of the characteristics of the p-type amorphous semiconductor layer 12a can be suppressed, whereby further improvement of the solar cell characteristics can be attained.

Further, the cap layer 30 is preferably made of an inorganic insulator such as a metal oxide such as silicon oxide or a metal nitride such as silicon nitride. When the cap layer 30 is made of an inorganic insulator, a p-type impurity and an n-type impurity can be inhibited from desorbing from the cap layer 30 by the plasma for forming the n-type amorphous semiconductor layer 13a. The inorganic insulator has higher plasma resistance as compared with the semiconductor material, whereby desorption of the constituent element of the cap layer 30 can also be suppressed. Therefore, the cap layer 30 can inhibit undesired impurities such as a p-type impurity and an n-type impurity from being contained in the space between the substrate 10 and the n-type amorphous semiconductor layer 13a. Thus, the junction between the substrate 10 and the n-type amorphous semiconductor layer 13a can be formed as designed, whereby the solar cell characteristics can be further improved.

(Method of Manufacturing Solar Cell)

A method of manufacturing the solar cell 100 according to the first embodiment is now described with reference to FIGS. 3 to 5.

First, an n-type single-crystalline silicon substrate in which a textured structure is previously formed on the photoreceiving surface A is prepared as the substrate 10.

Figure 3:
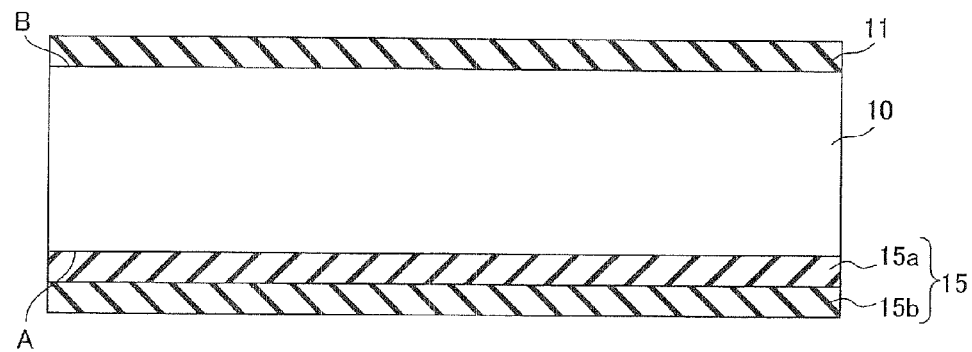
FIG. 3 is a sectional view for illustrating a step of manufacturing the solar cell according to the first embodiment of the present invention.

Then, the passivation film 15a consisting of an i-type amorphous silicon layer having a thickness of 3 nm to 5 nm is formed substantially on the whole of the photoreceiving surface A of the substrate 10 by CVD, and the antireflective film 15b consisting of a layer of a silicon nitride having a thickness of 50 nm to 150 nm is further successively stacked by CVD, as shown in FIG. 3. The light incidence-side structure 15 is constituted of the passivation film 15a and the antireflective film 15b. The passivation film 15a contains hydrogen, and hence the same has a function of passivating the substrate 10. The antireflective film 15b has an antireflective function. The multilayer structure of the i-type amorphous silicon layer and the silicon nitride layer is an example of the light incidence-side structure 15.

Then, the i-type amorphous semiconductor layer 11 made of i-type amorphous silicon having a thickness of 3 nm to 50 nm is formed substantially on the whole of the back surface B of the substrate 10 by CVD. The i-type amorphous semiconductor layer 11 contains hydrogen, and hence the same has a function of passivating the substrate 10.

Figure 4:
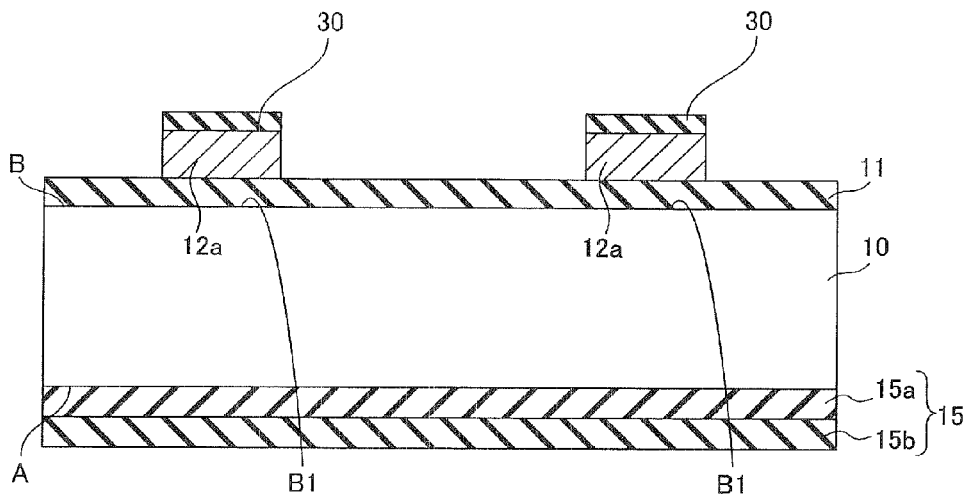
FIG. 4 is a sectional view for illustrating another step of manufacturing the solar cell according to the first embodiment of the present invention.

Then, the p-type amorphous semiconductor layer 12a made of p-type amorphous silicon having a thickness of 2 nm to 50 nm and the cap layer 30 made of i-type amorphous silicon having a thickness of 0.5 nm to 5 nm are successively formed on the surface of the i-type amorphous semiconductor layer 11 in a prescribed pattern by CVD employing a mask, as shown in FIG. 4. The prescribed pattern is a pattern corresponding to the first region B1 of the back surface B of the substrate 10.

Figure 5:
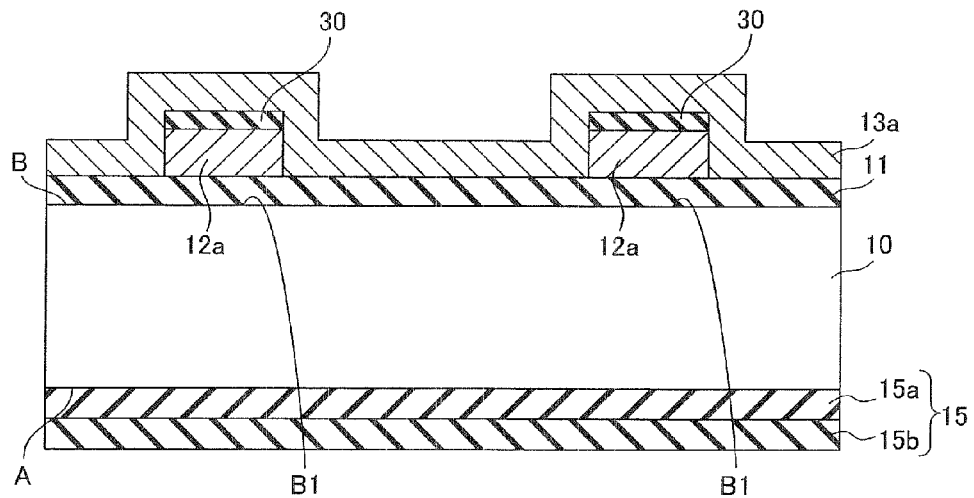
FIG. 5 is a sectional view for illustrating still another step of manufacturing the solar cell according to the first embodiment of the present invention.

Further, the n-type amorphous semiconductor layer 13a made of n-type amorphous silicon having a thickness of 2 nm to 50 nm is formed by CVD to extend over the surface of the i-type amorphous semiconductor layer 11 and the surface of the cap layer 30, as shown in FIG. 5.

Finally, the p-side electrode 20a and the n-side electrode 20b are formed on the surface of the n-type amorphous semiconductor layer 13a in prescribed patterns by a method such as sputtering or printing. Thus, the solar cell 100 according to the first embodiment is manufactured.

(Function and Effect)

In the solar cell 100 according to the first embodiment, the cap layer 30 is formed between the upper surface of the p-type amorphous semiconductor layer 12a and the n-type amorphous semiconductor layer 13a. The cap layer 30 is formed to suppress desorption of the impurity for doping contained in the p-type amorphous semiconductor layer 12a serving as the underlayer. Thus, the space between the substrate 10 and the n-type amorphous semiconductor layer 13a can be inhibited from contamination with the undesired impurity for doping. More specifically, the space between the surface of the i-type amorphous semiconductor layer 11 and the surface of the n-type amorphous semiconductor layer 13a can be inhibited from contamination with the undesired p-type impurity on the second region B2 of the back surface B of the substrate 10. In other words, junction characteristics between the substrate 10 and the n-type amorphous semiconductor layer 13a can be excellently maintained, whereby a solar cell having excellent solar cell characteristics can be provided.

Second Embodiment

A solar cell 150 according to a second embodiment of the present invention is now described with reference to FIG. 6.

(Structure of Solar Cell)

Figure 6:
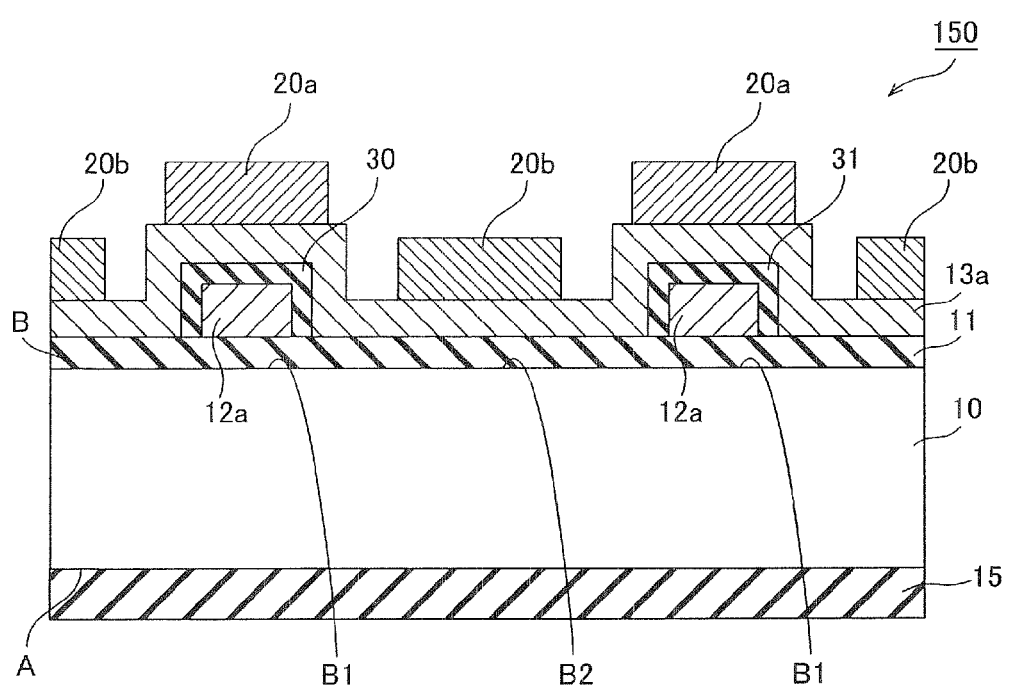
FIG. 6 is a sectional view of a solar cell according to a second embodiment of the present invention.

As shown in FIG. 6, a cap layer 31 is formed between the upper surface and the side surfaces of a p-type amorphous semiconductor layer 12a and an n-type amorphous semiconductor layer 13a in the solar cell 150 according to the second embodiment. The remaining structure of the second embodiment is similar to that of the aforementioned first embodiment.

(Method of Manufacturing Solar Cell)

A method of manufacturing the solar cell 150 according to the second embodiment is now described.

First, a light incidence-side structure 15 is formed substantially on the whole of a photoreceiving surface A of a substrate 10, similarly to the first embodiment. Further, an i-type amorphous semiconductor layer 11 is formed substantially on the whole of a back surface B of the substrate 10 by CVD. Then, the p-type amorphous semiconductor layer 12a is formed on the surface of the i-type amorphous semiconductor layer 11 in a prescribed pattern.

According to the second embodiment, the cap layer 31 made of i-type silicon is formed on the upper surface and the side surfaces of the p-type amorphous semiconductor layer 12a. Then, an n-type amorphous semiconductor layer 13a is formed to extend over the surface of the i-type amorphous semiconductor layer 11 and the surface of the cap layer 31.

Finally, a p-side electrode 20a and an n-side electrode 20b are formed on the surface of the n-type amorphous semiconductor layer 13a in prescribed patterns, similarly to the first embodiment. Thus, the solar cell 150 according to the second embodiment is manufactured.

(Function and Effect)

According to the second embodiment, the cap layer 31 containing no p-type impurity is formed not only between the upper surface of the p-type amorphous semiconductor layer 12a and the n-type amorphous semiconductor layer 13a but also between the side surfaces of the p-type amorphous semiconductor layer 12a and the n-type amorphous semiconductor layer 13a, whereby the space between the substrate 10 and the n-type amorphous semiconductor layer 13a can be further inhibited from contamination with an undesired p-type impurity.

Third Embodiment

A solar cell 200 according to a third embodiment of the present invention is now described with reference to FIGS. 7 to 11. In the following, points different from those of the first embodiment are mainly described.

(Structure of Solar Cell)

Figure 7:
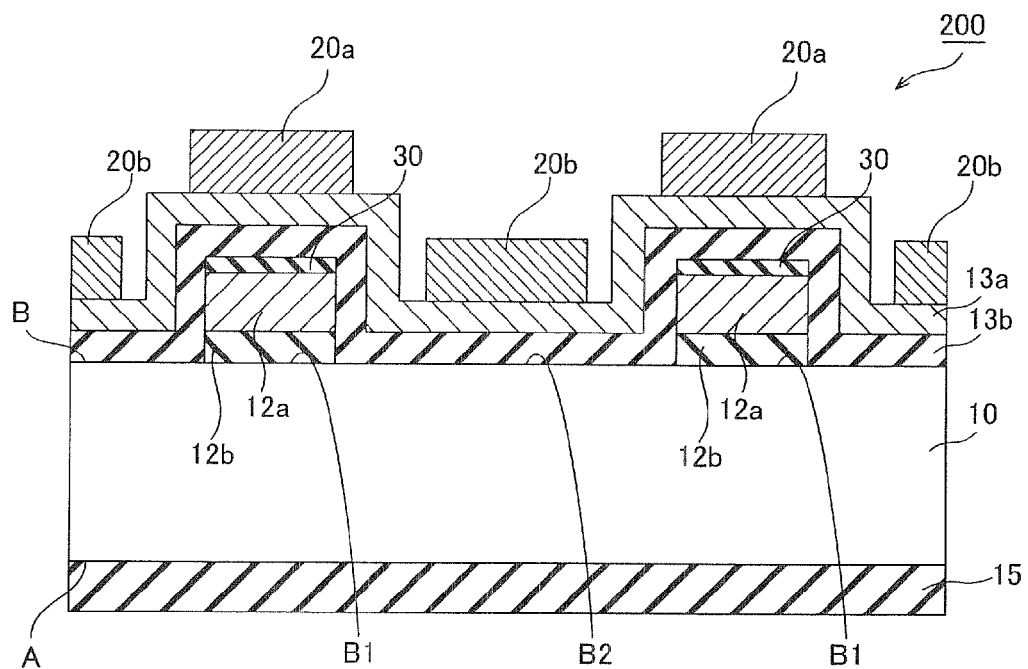
FIG. 7 is a sectional view of a solar cell according to a third embodiment of the present invention.

FIG. 7 is a sectional view of the solar cell 200 according to the third embodiment of the present invention. As shown in FIG. 7, an i-type amorphous semiconductor layer 12b and a p-type amorphous semiconductor layer 12a are successively stacked on the surface of a first region B1 of a back surface B of a substrate 10. In other words, the i-type amorphous semiconductor layer 12b is formed between the semiconductor substrate 10 and the p-type amorphous semiconductor layer 12a. A cap layer 30 is formed on the upper surface of the p-type amorphous semiconductor layer 12a. An i-type amorphous semiconductor layer 13b and a p-type amorphous semiconductor layer 13a are stacked to extend over the back surface B (a second region B2 adjacent to the first region B1 on which the p-type amorphous semiconductor layer 12a is formed) of the substrate 10 and the surface of the cap layer 30. The i-type amorphous semiconductor layer 12b is an example of the "fourth semiconductor layer" in the present invention, and the i-type amorphous semiconductor layer 13b is an example of the "fifth semiconductor layer" in the present invention. According to the third embodiment, the "third semiconductor layer" in the present invention is constituted of the i-type amorphous semiconductor layer 12b and the i-type amorphous semiconductor layer 13b.

(Method of Manufacturing Solar Cell)

A method of manufacturing the solar cell 200 according to the third embodiment is now described with reference to FIGS. 8 to 11.

Figure 8:
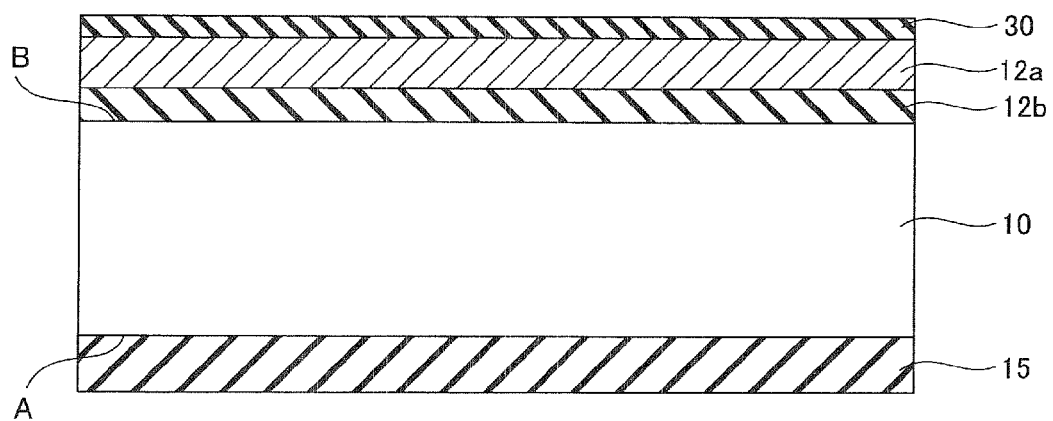
FIG. 8 is a sectional view for illustrating a step of manufacturing the solar cell according to the third embodiment of the present invention.

First, the substrate 10 made of n-type single-crystalline silicon in which a textured structure is previously formed on the photoreceiving surface A is prepared, similarly to the first embodiment. Then, a light incidence-side structure 15 is formed substantially on the whole of the photoreceiving surface A of the substrate 10, as shown in FIG. 8.

Then, the i-type amorphous semiconductor layer 12b made of i-type amorphous silicon having a thickness of 3 nm to 50 nm, the p-type amorphous semiconductor layer 12a having a thickness of 2 nm to 50 nm and the cap layer 30 having a thickness of 0.5 nm to 5 nm are successively formed substantially on the whole of a back surface B of the substrate 10 by CVD. The cap layer 30 is formed without positively introducing p-type and n-type impurities for doping.

Figure 9:
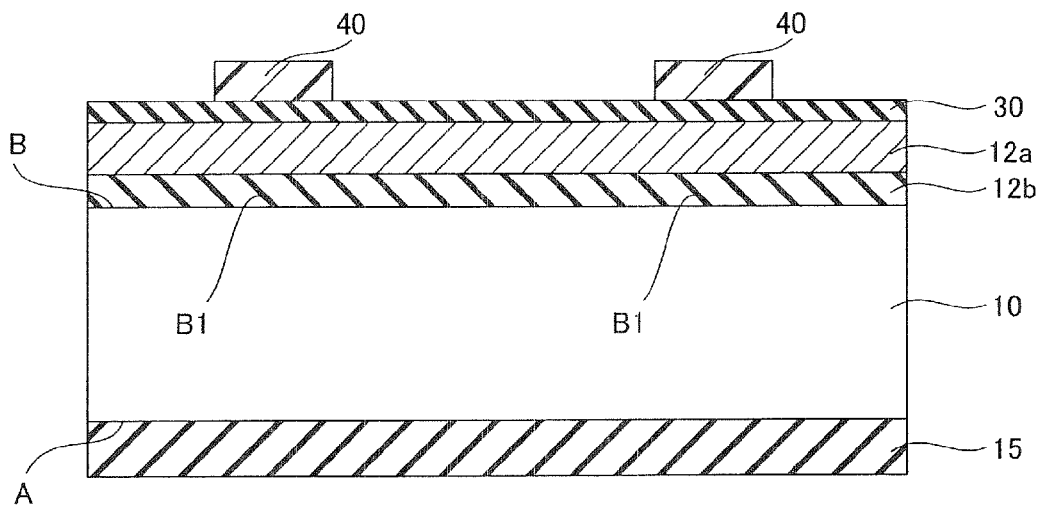
FIG. 9 is a sectional view for illustrating another step of manufacturing the solar cell according to the third embodiment of the present invention.

Then, a resist film 40 is formed on the surface of the cap layer 30 in a prescribed pattern, as shown in FIG. 9. The prescribed pattern is a pattern corresponding to the pattern of the first region B1 on the back surface B of the substrate 10.

Figure 10:
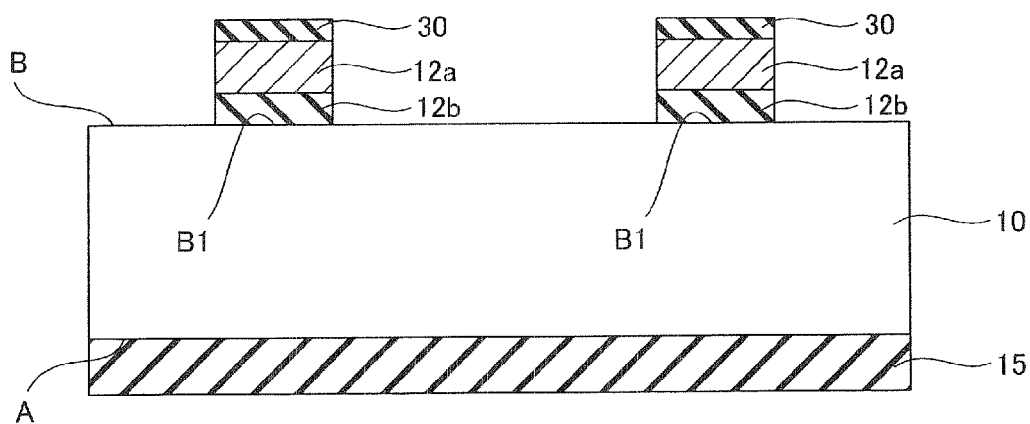
FIG. 10 is a sectional view for illustrating still another step of manufacturing the solar cell according to the third embodiment of the present invention.

Then, portions of the i-type amorphous semiconductor layer 12b, the p-type amorphous semiconductor layer 12a and the cap layer 30 exposed from the resist film 40 are removed by etching, and the resist film 40 is thereafter removed, as shown in FIG. 10. A multilayer film of the i-type amorphous semiconductor layer 12b, the p-type amorphous semiconductor layer 12a and the cap layer 30 is formed on the surface of the first region B1 on the back surface B of the substrate 10 through this step.

While FIG. 10 shows an example of removing the multilayer film of the i-type amorphous semiconductor layer 12b, the p-type amorphous semiconductor layer 12a and the cap layer 30 until the back surface B of the substrate 10 is exposed, the same may be removed by etching to expose the i-type amorphous semiconductor layer 12b. In this step, at least the p-type amorphous semiconductor layer 12 may be removed, and part of the i-type amorphous semiconductor layer 12b may remain on the back surface B of the substrate 10.

Figure 11:
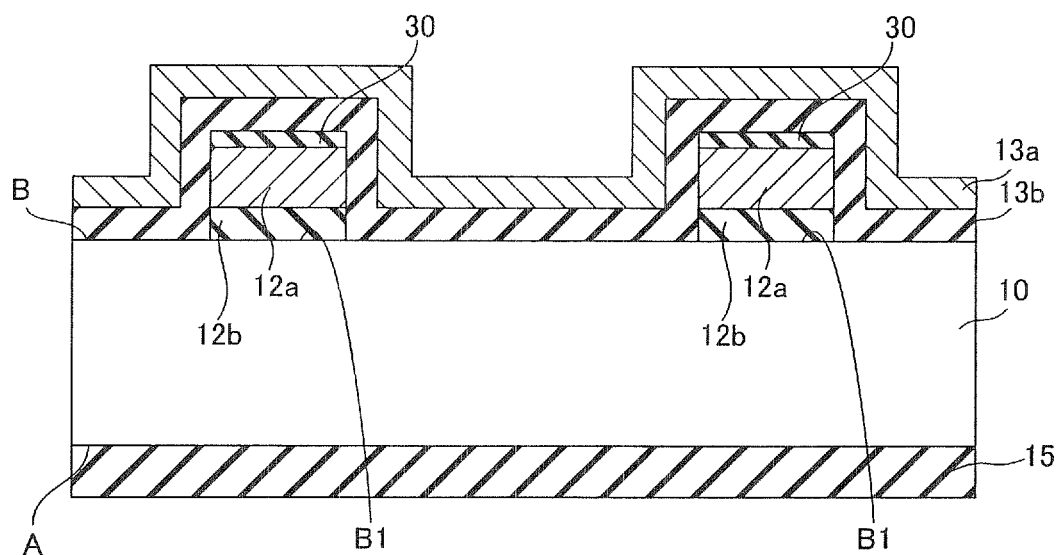
FIG. 11 is a sectional view for illustrating a further step of manufacturing the solar cell according to the third embodiment of the present invention.

Then, the i-type amorphous semiconductor layer 13b made of i-type amorphous silicon having a thickness of 3 nm to 50 nm and the n-type amorphous semiconductor layer 13a having a thickness of 2 nm to 50 nm are successively formed by CVD to extend over the back surface B of the substrate 10 and the surface of the cap layer 30, as shown in FIG. 11. More specifically, the i-type amorphous semiconductor layer 13b and the n-type amorphous semiconductor layer 13a are formed substantially on the whole of the back surface B of the substrate 10.

Finally, a p-side electrode 20a and an n-side electrode 20b are formed on the surface of the n-type amorphous semiconductor layer 13a in prescribed patterns by a method such as sputtering or printing. Thus, the solar cell 200 according to the third embodiment is manufactured.

(Function and Effect)

In the solar cell 200 according to the third embodiment, an undesired doping impurity can be inhibited from being contained in the space between the substrate 10 and the n-type amorphous semiconductor layer 13a by the cap layer 30 similarly to the first embodiment, whereby solar cell characteristics can be improved.

Fourth Embodiment

A solar cell 250 according to a fourth embodiment of the present invention is now described with reference to FIGS. 12 and 13.

(Structure of Solar Cell)

Figure 12:
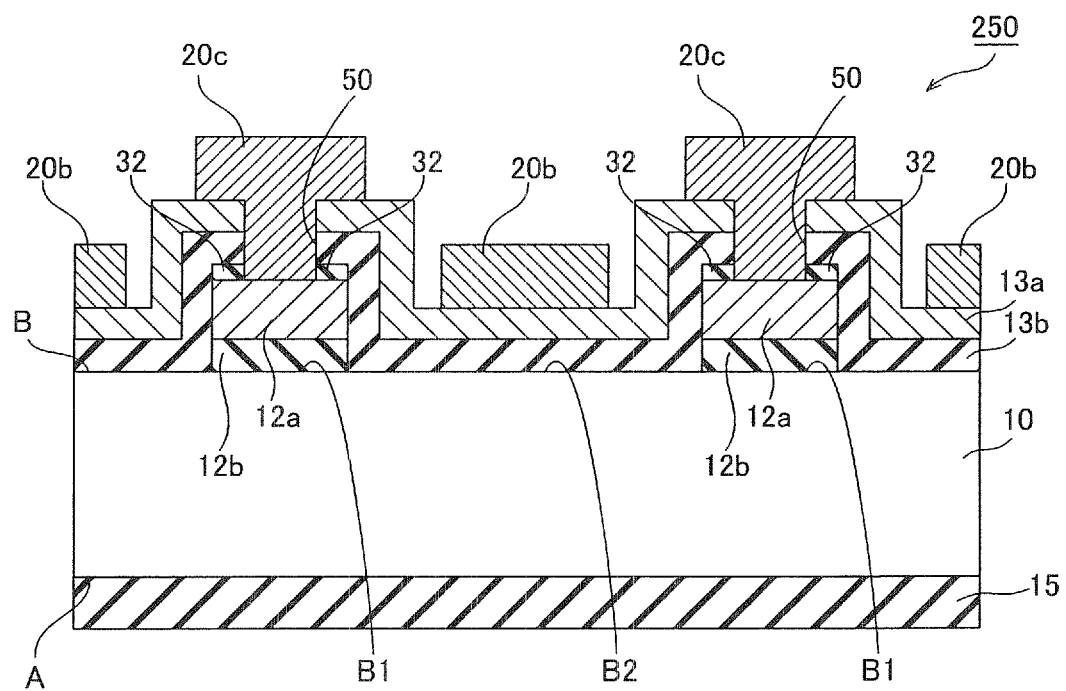
FIG. 12 is a sectional view of a solar cell according to a fourth embodiment of the present invention.

In the solar cell 250 according to the fourth embodiment, a cap layer 32 is made of an insulator, as shown in FIG. 12. More specifically, the cap layer 32 is made of an insulating material such as a metal oxide or a metal nitride. Further, a contact hole 50 is formed in an n-type amorphous semiconductor layer 13a, an i-type amorphous semiconductor layer 13b and the cap layer 32. A p-side electrode layer 20c is formed to be in contact with a p-type amorphous semiconductor layer 12a through the contact hole 50. More specifically, the p-side electrode layer 20c is formed to fill up the contact hole 50. The remaining structure of the fourth embodiment is similar to that of the aforementioned third embodiment.

(Method of Manufacturing Solar Cell)

A method of manufacturing the solar cell 250 according to the fourth embodiment is now described with reference to FIG. 13.

First, a light incidence-side structure 15 is formed substantially on the whole of a photoreceiving surface A of a substrate 10, similarly to the third embodiment. Then, an i-type amorphous semiconductor layer 12b, the p-type amorphous semiconductor layer 12a, the cap layer 32, the i-type amorphous semiconductor layer 13b and the n-type amorphous semiconductor layer 13a are successively formed on a back surface B of the substrate 10. According to the fourth embodiment, the cap layer 32 is made of the insulating material such as a metal oxide or a metal nitride, dissimilarly to the third embodiment.

Figure 13:
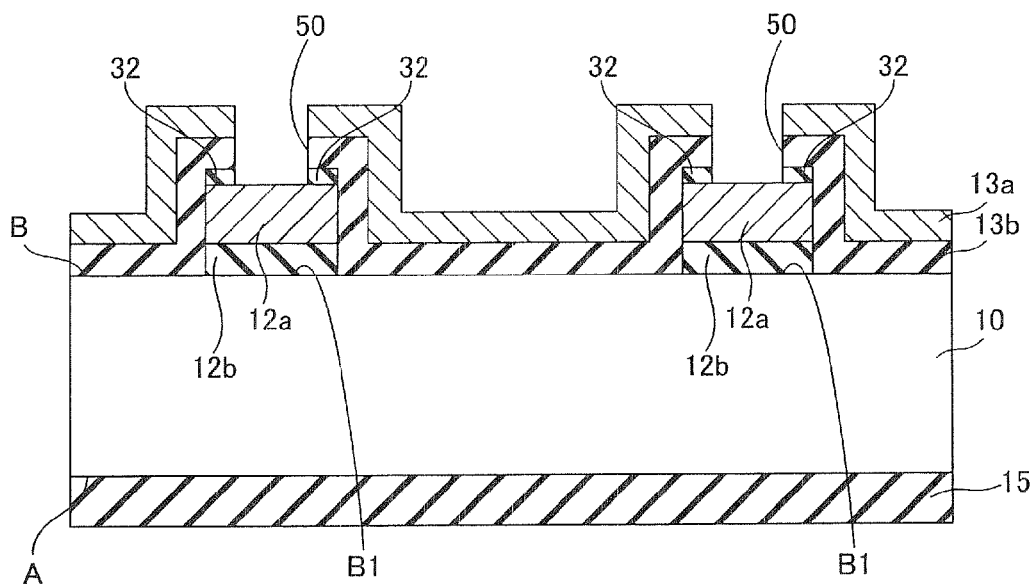
FIG. 13 is a sectional view for illustrating a step of manufacturing the solar cell according to the fourth embodiment of the present invention.

According to the fourth embodiment, the contact hole 50 is formed in the n-type amorphous semiconductor layer 13a, the i-type amorphous semiconductor layer 13b and the cap layer 32 by etching, as shown in FIG. 13. Then, the p-side electrode layer 20c is formed to be in contact with the p-type amorphous semiconductor layer 12a through the contact hole 50. More specifically, the p-side electrode layer 20c is formed to fill up the contact hole 50.

Then, an n-side electrode 20b is formed on the surface of the n-type amorphous semiconductor layer 13a in a prescribed pattern, similarly to the third embodiment. Thus, the solar cell 250 according to the fourth embodiment is manufactured.

(Function and Effect)

In the solar cell 250 according to the fourth embodiment, the cap layer 32 is made of the insulating material such as a metal oxide or a metal nitride. In the solar cell 250, further, the contact hole 50 is formed in the n-type amorphous semiconductor layer 13a, the i-type amorphous semiconductor layer 13b and cap layer 32, and the p-side electrode layer 20c is formed to fill up the contact hole 50. Thus, the p-side electrode layer 20c can be brought into direct contact with the p-type amorphous semiconductor layer 12a, whereby collection efficiency for carriers can be improved.

Other Embodiments

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are included.

For example, while the p-type amorphous semiconductor layer 12a and the cap layer 30 have been formed on the first region B1 of the back surface B of the substrate 10 and the n-type amorphous semiconductor layer 13a has been formed to extend over the second region B2 of the back surface B of the substrate 10 and the surface of the cap layer 30 in each of the first to third embodiments, the arrangement relation between the p-type amorphous semiconductor layer 12a and the n-type amorphous semiconductor layer 13a may be reversed thereto. In other words, the n-type amorphous semiconductor layer 13a and the cap layer 30 may be formed on the first region B1 of the back surface B of the substrate 10, and the p-type amorphous semiconductor layer 12a may be formed to extend over the second region B2 of the back surface B of the substrate 10 and the surface of the cap layer 30. Also in such a structure, the space between the surface of the substrate 10 and the p-type amorphous semiconductor layer 12a can be inhibited from contamination with an undesired n-type impurity by the cap layer 30, whereby a solar cell having excellent solar cell characteristics can be provided.

EXAMPLE

Example Sample

Example of the present invention is now described. In this Example, the solar cell 200 shown in FIG. 7 was manufactured as follows:

First, anisotropic etching was performed on a substrate 10 made of n-type single-crystalline silicon having a thickness of about 200 μm, and textured structures were formed on a photoreceiving surface A and a back surface B of the substrate 10.

Then, an i-type amorphous semiconductor layer 15 made of i-type amorphous silicon having a thickness of 10 nm was formed on the photoreceiving surface A of the substrate 10 by plasma CVD, by employing mixed gas of $SiH_4$ and $H_2$ as source gas.

Then, an i-type amorphous semiconductor layer 12b having a thickness of 20 nm, a p-type amorphous semiconductor layer 12a made of p-type amorphous silicon having a thickness of 10 nm and a cap layer 30 made of i-type amorphous silicon were successively formed on a first region B1 of the back surface B of the substrate 10 by plasma CVD, by employing $SiH_4$, $H_2$ and $B_2H_6$ as source gas. In this Example, the i-type amorphous semiconductor layer 12b, the p-type amorphous semiconductor layer 12a and the cap layer 30 were formed in prescribed patterns by employing a mask. When forming the cap layer 30, the thickness of the cap layer 30 was varied to 0.5 nm, 1 nm, 1.5 nm, 2 nm, 2.5 nm, 3 nm, 3.5 nm, 4 nm, 4.5 nm, 5 nm, 6 nm, 7 nm and 8 nm, for manufacturing 13 samples in which the thicknesses of cap layers 30 were different from each other.

Then, an i-type amorphous semiconductor layer 13b made of i-type amorphous silicon having a thickness of 3 nm and an n-type amorphous semiconductor layer 13a made of n-type amorphous silicon having a thickness of 20 nm were successively formed by plasma CVD to extend over the surface of a second region B2 of the back surface B of the substrate 10 and the surface of the cap layer 30, by employing $SiH_4$, $H_2$ and $PH_3$ as source gas. The formation of the i-type amorphous semiconductor layer 13b was performed while setting the quantity of introduction of $PH_3$ to zero.

Finally, a p-side electrode 20a and an n-side electrode 20b were pattern-formed by printing.

Example samples were manufactured in the aforementioned manner.

Comparative Example Sample

A comparative example sample was manufactured similarly to the aforementioned Example, except that no cap layer 30 was provided.

(Results)

Results of measuring solar cell characteristics are now described with reference to the Example samples and the comparative example sample.

Figure 14:
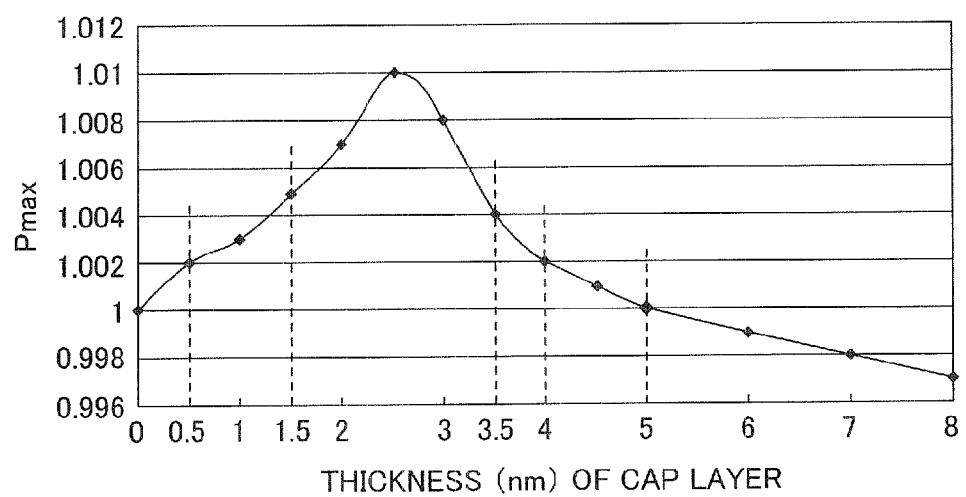
FIG. 14 is a characteristic diagram showing the relation between an output of the solar cell according to the third embodiment and the thickness of a cap layer.

FIG. 14 is a characteristic diagram showing the results of measuring the solar cell characteristics as to the Example samples and the comparative example sample. The axis of ordinates of the drawing shows relative values of outputs of the solar cells, which are values standardized on the assumption that the output of the comparative example sample in which the thickness of the cap layer 30 was 0 nm was 1. The axis of abscissas shows the thicknesses (nm) of the cap layers 30.

As shown in FIG. 14, it is understood that the solar cell characteristics are improved by providing the cap layer 30. This is conceivably because it was possible to inhibit an undesired doping impurity from being contained in the space between the substrate 10 and the n-type amorphous semiconductor layer 13a by providing the cap layer 30.

Further, it is understood that the output is improved as compared with the comparative example sample if the cap layer 30 simply has a slight thickness. Therefore, the thickness of the cap layer 30 may simply be at least several nm.

In addition, it was understood that the output is improved as compared with the comparative example sample by setting the thickness of the cap layer 30 to not more than 5 nm. If the thickness of the cap layer 30 is greater than 5 nm, the output lowers as compared with the comparative example sample. The reason why the output lowers in this manner is conceivably because resistance between the p-side electrode 20a and the p-type amorphous silicon layer 12 increased by increasing the thickness of the cap layer 30.

Therefore, the thickness of the cap layer is preferably in the range of at least several nm and not more than 5 nm, more preferably in the range of at least 0.5 nm and not more than 4 nm, and further preferably in the range of at least 1.5 nm and not more than 3.5 nm.

What is claimed is:

1. A solar cell comprising:
 a semiconductor substrate having a photo receiving surface and a back surface;
 a first semiconductor layer of a first conductivity type formed on a prescribed region of the back surface of said semiconductor substrate;
 a second semiconductor layer of a second conductivity type formed to extend over the back surface of said semiconductor substrate and the surface of said first semiconductor layer; and
 a cap layer, formed between said first semiconductor layer and said second semiconductor layer, made of a semiconductor or an insulator substantially containing no impurity of said first conductivity type,
 wherein the solar cell further comprises a p-side electrode and an n-side electrode directly formed on the back surface of said second semiconductor layer.

2. The solar cell according to claim 1, wherein said cap layer is formed between at least the upper surface of said first semiconductor layer and said second semiconductor layer.

3. The solar cell according to claim 2, wherein said cap layer is formed between the upper surface and the side surface of said first semiconductor layer and said second semiconductor layer.

4. The solar cell according to claim 1, wherein said cap layer is made of a semiconductor.

5. The solar cell according to claim 1, wherein said cap layer is made of an insulator.

6. The solar cell according to claim 5, wherein said second semiconductor layer and said cap layer include a contact hole, and the solar cell further comprises an electrode layer formed to be in contact with the first semiconductor layer through said contact hole.

7. The solar cell according to claim 1, wherein the thickness of said cap layer is smaller than the thicknesses of said first semiconductor layer and said second semiconductor layer.

8. The solar cell according to claim 1, further comprising an intrinsic third semiconductor layer formed between said semiconductor substrate and said first and second semiconductor layers.

9. The solar cell according to claim 8, wherein said third semiconductor layer is formed on said prescribed region of the back surface of said semiconductor substrate on which said first semiconductor layer is formed and a region adjacent to said prescribed region, and said second semiconductor layer is formed to extend over the surface of said third semiconductor layer and the surface of said cap layer.

10. The solar cell according to claim 8, wherein said third semiconductor layer includes a fourth semiconductor layer formed on said prescribed region of the back surface of said semiconductor substrate on which said first semiconductor layer is formed.

11. The solar cell according to claim 10, wherein said third semiconductor layer further includes a fifth semiconductor layer formed to extend over a region adjacent to said prescribed region of the back surface of said semiconductor substrate on which said first semiconductor layer is formed and the surface of said cap layer.

12. The solar cell according to claim 8, wherein said third semiconductor layer is an amorphous semiconductor layer.

13. The solar cell according to claim 1, wherein said cap layer is made of the same semiconductor material as said first semiconductor layer.

14. The solar cell according to claim 1, wherein said cap layer contains neither an impurity of said first conductivity type nor an impurity of said second conductivity type.

15. The solar cell according to claim 14, wherein said cap layer is an intrinsic amorphous semiconductor layer.

16. The solar cell according to claim 1, wherein said semiconductor substrate is a crystalline semiconductor substrate.

17. The solar cell according to claim 16, wherein said semiconductor substrate is a single-crystalline semiconductor substrate of the second conductivity type.

18. The solar cell according to claim 1, further comprising a light incidence-side structure formed on the photo receiving surface of said semiconductor substrate.

19. The solar cell according to claim 18, wherein said light incidence-side structure includes at least an antireflective film.

20. The solar cell according to claim 19, wherein said light incidence-side structure includes a passivation film, in addition to said antireflective film.

* * * * *